United States Patent
Juva et al.

(10) Patent No.: US 11,489,354 B2
(45) Date of Patent: Nov. 1, 2022

(54) DETECTION OF FALSE REPORTING IN A SMART BATTERY SYSTEM

(71) Applicant: TANKTWO OY, Vantaa (FI)

(72) Inventors: Heikki Juva, Kerava (FI); Paavo Helenius, Akaa (FI); Timo Rissanen, Helsinki (FI); Juha Tuomola, Vantaa (FI)

(73) Assignee: TANKTWO OY, Vantaa (FI)

( * ) Notice: Subject to any disclaimer, the term of this patent is extended or adjusted under 35 U.S.C. 154(b) by 469 days.

(21) Appl. No.: 16/348,974

(22) PCT Filed: Nov. 7, 2017

(86) PCT No.: PCT/EP2017/078494
§ 371 (c)(1),
(2) Date: May 10, 2019

(87) PCT Pub. No.: WO2018/087094
PCT Pub. Date: May 17, 2018

(65) Prior Publication Data
US 2019/0285703 A1    Sep. 19, 2019

(30) Foreign Application Priority Data

Nov. 10, 2016 (GB) .................................... 1618971

(51) Int. Cl.
*G01R 31/392* (2019.01)
*G01R 31/396* (2019.01)
(Continued)

(52) U.S. Cl.
CPC .......... *H02J 7/0047* (2013.01); *B60L 3/0046* (2013.01); *B60L 3/04* (2013.01); *B60L 3/12* (2013.01);
(Continued)

(58) Field of Classification Search
CPC .... H02J 7/0047; H02J 7/00036; H02J 7/0063; H02J 7/0021; H02J 7/007; H02J 7/0013;
(Continued)

(56) References Cited

U.S. PATENT DOCUMENTS 5,170,124 A * 12/1992 Blair .................... G01R 31/396
340/636.15
5,298,851 A * 3/1994 DeNardis ................ G05F 1/468
322/28

(Continued)

FOREIGN PATENT DOCUMENTS

DE    102010032523 A1    2/2012
EP    1 308 739 A2    5/2003
EP    2634889 A1 *    9/2013    ............ B60L 3/0046

OTHER PUBLICATIONS

Partial International Search Report, dated Feb. 7, 2018 issued in International Application No. PCT/EP2017/078494.
(Continued)

*Primary Examiner* — Stacy Whitmore

(57) ABSTRACT

A method of detecting false state information reported by a battery unit, wherein the battery unit comprises a monitoring system configured to monitor and report state information of the battery unit. A log of state information reported by the battery unit is inspected in order to determine whether or not there is a change in state information which is inconsistent with normal operation of the battery unit. If there is a change in state information which is inconsistent with normal operation of the battery unit, then it is determined that the battery unit has reported false state information.

7 Claims, 2 Drawing Sheets

(51) Int. Cl.
  *H01M 10/48* (2006.01)
  *H02J 7/00* (2006.01)
  *B60L 3/12* (2006.01)
  *B60L 3/00* (2019.01)
  *B60L 3/04* (2006.01)
  *H01M 10/42* (2006.01)

(52) U.S. Cl.
  CPC ......... *G01R 31/392* (2019.01); *G01R 31/396* (2019.01); *H01M 10/482* (2013.01); *H02J 7/007* (2013.01); *H02J 7/0013* (2013.01); *H02J 7/0021* (2013.01); *H02J 7/00036* (2020.01); *H02J 7/0063* (2013.01); *B60L 2240/545* (2013.01); *B60L 2240/547* (2013.01); *B60L 2240/549* (2013.01); *B60L 2250/10* (2013.01); *H01M 10/4257* (2013.01); *H01M 2010/4271* (2013.01); *H02J 7/0048* (2020.01); *H02J 2007/0067* (2013.01); *Y02T 10/70* (2013.01)

(58) Field of Classification Search
  CPC ............. H02J 7/0048; H02J 2007/0067; H02J 7/0025; H02J 7/00047; B60L 3/12; B60L 3/0046; B60L 3/04; B60L 2240/547; B60L 2250/10; B60L 2240/549; B60L 2240/545; B60L 58/10; G01R 31/392; G01R 31/396; H01M 10/482; H01M 10/4257; H01M 2010/4271; Y02T 10/70; Y02E 60/10
  See application file for complete search history.

(56) References Cited

U.S. PATENT DOCUMENTS

| | | | | |
|---|---|---|---|---|
| 5,552,953 | A * | 9/1996 | Meyerdirks | H02J 7/0029 361/115 |
| 5,710,503 | A * | 1/1998 | Sideris | H02J 7/0022 324/431 |
| 6,762,587 | B1 * | 7/2004 | Barbetta | H01M 8/04955 320/116 |
| 7,107,161 | B2 * | 9/2006 | Ahmed | G01R 31/367 324/429 |
| 10,534,028 | B2 * | 1/2020 | Stewart | H01M 10/0525 |
| 10,536,011 | B2 * | 1/2020 | Shlemenzon | H02J 1/00 |
| 11,035,901 | B2 * | 6/2021 | Yoshida | G01R 31/392 |
| 2003/0008202 | A1 * | 1/2003 | Tran | H01M 10/48 429/61 |
| 2004/0138785 | A1 | 7/2004 | Emori et al. | |
| 2005/0027466 | A1 * | 2/2005 | Steinmetz | H04M 1/24 702/63 |
| 2005/0206388 | A1 * | 9/2005 | Quint | H01M 10/48 324/430 |
| 2006/0261780 | A1 * | 11/2006 | Edington | H01M 10/48 320/130 |
| 2011/0307202 | A1 * | 12/2011 | Benjamin | G01R 19/16542 702/63 |
| 2013/0127611 | A1 * | 5/2013 | Bernstein | H01M 10/4285 340/455 |
| 2013/0162052 | A1 * | 6/2013 | Gaul | G01R 31/40 307/115 |
| 2013/0169234 | A1 * | 7/2013 | Chuah | H01M 10/44 320/136 |
| 2013/0197734 | A1 * | 8/2013 | Okura | B60L 50/66 701/22 |
| 2014/0088896 | A1 * | 3/2014 | Hu | G01R 31/3835 702/63 |
| 2014/0229130 | A1 * | 8/2014 | Koba | G01R 31/3648 702/63 |
| 2014/0347100 | A1 * | 11/2014 | Seveau | G01R 19/0038 327/63 |
| 2014/0365065 | A1 * | 12/2014 | Leonard | B60L 50/52 701/29.6 |
| 2015/0056479 | A1 * | 2/2015 | Poehler | H01M 10/052 429/50 |
| 2016/0169978 | A1 | 6/2016 | Fukuhara | |
| 2017/0163068 | A1 * | 6/2017 | Li | G05B 19/048 |
| 2017/0207430 | A1 * | 7/2017 | Conrad | H01M 50/502 |
| 2017/0259687 | A1 * | 9/2017 | Chikkannanavar | H02J 7/007184 |
| 2017/0355276 | A1 * | 12/2017 | Chang | G01R 31/3842 |
| 2018/0003775 | A1 * | 1/2018 | Hashimoto | B60L 3/0069 |
| 2018/0034113 | A1 * | 2/2018 | Gibbs | G01R 19/16542 |
| 2018/0090950 | A1 * | 3/2018 | Huang | H01M 10/425 |
| 2018/0236890 | A1 * | 8/2018 | Cyrne | H01M 10/486 |
| 2020/0091562 | A1 * | 3/2020 | Mi | H01M 10/482 |
| 2021/0134421 | A1 * | 5/2021 | Mousseau | G16H 20/13 |
| 2021/0140151 | A1 * | 5/2021 | Johnson | E03B 7/071 |
| 2021/0181260 | A1 * | 6/2021 | Kondo | G01R 31/367 |
| 2021/0316712 | A1 * | 10/2021 | Huh | B60W 30/188 |
| 2021/0362731 | A1 * | 11/2021 | Park | B60W 40/12 |
| 2021/0376613 | A1 * | 12/2021 | Cummings | H02J 7/007 |
| 2022/0007438 | A1 * | 1/2022 | Agrawal | H04W 24/08 |
| 2022/0031213 | A1 * | 2/2022 | Stevens | G16H 40/67 |

OTHER PUBLICATIONS

International Search Report, dated Feb. 7, 2018, and Written Opinion issued in International Application No. PCT/EP2017/078494.
Combined Search and Examination report, dated Apr. 27, 2017, issued in priority GB Application No. 1618971.4.

* cited by examiner

DETECTION OF FALSE REPORTING IN A SMART BATTERY SYSTEM

CROSS REFERENCE TO RELATED APPLICATIONS

This application claims the priority of International Application No. PCT/EP2017/078494, filed on Nov. 7, 2017, which claims priority to GB Application No. 1618971.4, filed Nov. 10, 2016, the entire contents of each of which are fully incorporated herein by reference.

FIELD OF THE INVENTION

The invention relates to an energy storage and utilization system based on smart battery units. In particular, the invention relates to anomaly detection of the smart battery units within the ecosystem.

BACKGROUND

In a system containing a large number of swappable battery units (e.g. a system of battery units for electric vehicles which can be swapped at service stations, as an alternative to recharging from an external power supply), there is a need to provide a valuation of the battery units. This is because the value of the battery units themselves is likely to be much higher than the value of the energy stored therein—for example, a brand new battery unit with a high capacity would clearly be more valuable than a several-year-old battery unit with a small percentage of its operating capacity remaining.

GB 2518248 describes how values can be assigned in such a system. In summary, state information is reported by the battery units to a central valuation service, which uses the state information (along with hardware information and historical state information previously reported by that unit) to determine a valuation for the unit. The valuation may be a monetary value, or a series of ratings (e.g. scores out of 5 for each of reliability, charge capacity, peak output power, etc). The valuation relies on the battery units periodically sending the state information to the valuation service. The state information may include electrical performance data of the battery unit (e.g. capacity, number of charge/discharge cycles, peak current), administrative data of the battery unit (e.g. software version, hardware version, and which electric tank it is associated with), and/or environmental factors (e.g. temperature, sudden acceleration).

Also other devices of the ecosystem measure and send log data of multiple variables, such as temperature, power output, et cetera to the centralized computer system. The devices in the system have also known relationship, for example a battery unit is inside one electric tank, which is controlled by one ETCU and is powering one electric car. A battery unit may also be inside a storage silo of the service station. The identifications of the battery units, ETCUs, electric vehicles and service stations are known and registered in the system.

Interfaces between the smart battery units and centralized computer system are secured but there is always a certain risk that the smart battery units can be tampered or the transmission can be attacked and log data would not be correct. Since the usage history data of the smart battery unit has direct correlation to the resale value of the smart battery unit, there is clear monetary incentive to manipulate the usage history to look better than it has actually been. False data could either be inserted by the battery units themselves, or by a "man-in-the-middle" attack, for example where the state information is transmitted via the electric car. Similarly, the electric tank may falsely report some data—e.g. if there is an environmental factor measured at the tank but not by the battery units, then falsely reporting the value of this factor would raise the value of all battery units in the tank.

SUMMARY

This invention defines anomaly detection methods which can be used to find out fraudulent log data. The data collected from the different parts of the system is likely to also have some kind of relationships. The relationship may be between same types of units (for example temperature of different battery units in the same tank is in the same range) or between different types of units (for example power output of electric tank and power input of the electric vehicle should be equal). By comparing the data collected from the different units, the relationships can be found and patterns emerge. In case of abnormal patterns are emerging it is an indication of some type of unwanted action in the system.

Anomaly detection can be done in all levels of the system not only in the centralized computer system. The electric tank control unit also collects the usage data from the battery units located in the tank. Same applies also to the service station control unit which locally collects data from the battery units located inside the storage silos of the service station.

Some detected anomalies may be caused by system malfunction instead of fraudulent manipulation of the data. In these cases anomaly detection functionality and the automated reactions based on findings can be used to protect the system and the users and make it safer.

According to an aspect, there is provided a method of detecting reporting of false electrical performance data by battery units operating within an energy storage and supply system comprising a tank containing a plurality of randomly packed battery units, the tank having electrical contacts for either drawing energy from battery units or supplying energy to battery units within the tank during normal use. Data reporting energy claimed to have been extracted from or supplied to the battery unit is received from each of the battery units. The actual total energy extracted from or supplied to the plurality of battery units is measured. The reported data and the measured data are compared to determine whether or not the battery units are reporting false electrical performance data.

According to a further aspect, there is provided apparatus configured to detect reporting of false electrical performance data by battery units operating within an energy storage and supply system comprising a tank containing a plurality of randomly packed battery units, the tank having electrical contacts for either drawing energy from battery units or supplying energy to battery units within the tank during normal use. The apparatus comprises a communication unit and an anomaly detection unit. The communication unit is configured to communicate with the battery units and the electrical storage and supply system. The anomaly detection unit is configured to, for each of the battery units:
  receive from each of the battery units, data reporting energy claimed to have been extracted from or supplied to the battery unit;
  measure the actual total energy extracted from or supplied to the plurality of battery units; and
  compare the reported data and the measured data to determine whether or not the battery units are reporting false electrical performance data.

According to a further aspect, there is provided a method of detecting false state information reported by a battery unit, wherein the battery unit comprises a reporting system configured to measure and report state information of the battery unit. The method is performed at a monitoring system configured to receive reports from a plurality of battery units. A log of state information reported by the battery unit is inspected in order to determine whether or not there is a change in state information which is inconsistent with normal operation of the battery unit. If there is a change in state information which is inconsistent with normal operation of the battery unit, then it is determined that the battery unit has reported false state information.

According to a further aspect, there is provided apparatus configured to detect false data reported by battery units, wherein each battery unit comprises a reporting system configured to measure and report state information of the battery unit. The apparatus comprises a communication unit, and an anomaly detection unit. The communications unit is configured to communicate with the battery units. The anomaly detection unit is configured to, for each battery unit:
  receive state information reported by the battery unit;
  inspect a log of state information reported by the battery unit in order to determine whether or not there is a change in state information which is inconsistent with normal operation of the battery unit;
  if there is a change in state information which is inconsistent with normal operation of the battery unit, then determine that the battery unit has reported false data.

According to a further aspect, there is provided a method of detecting false state information reported by battery units, wherein each battery unit comprises a reporting system configured to measure and report state information of the battery unit. The method is performed at a monitoring system. Reported state information is received from each of a plurality of battery units and other devices. State information reported by each battery unit is compared with state information reported by one or more devices external to the battery unit which were in proximity to the battery unit or in electrical contact with the battery unit at the time the state information was monitored. If the state information reported by the battery unit is inconsistent with the state information of the device external to the battery unit, then it is determined that the battery unit has reported false state information.

According to a further aspect, there is provided apparatus configured to detect false data reported by battery units, wherein each battery unit comprises a reporting system configured to measure and report state information of the battery unit. The apparatus comprises a communications unit and an anomaly detection unit. The communications unit is configured to communicate with the battery units and other devices. The anomaly detection unit is configured to:
  receive state information reported the battery units and other devices; for each battery unit:
  compare state information reported by the battery unit with state information reported by a device external to the battery unit which was in proximity to the battery unit or electrical contact with the battery unit at the time the state information was monitored;
  if the state information reported by the battery unit is inconsistent with the state information of the other device, then determine that the battery unit has reported false data.

According to a further aspect, there is provided a method of detecting tampering with an energy storage and supply system, the energy storage and supply system comprising an electric tank and a plurality of battery units, wherein the plurality of battery units are randomly packed within the electric tank. Locations and/or identities of the plurality of battery units within the electric tank at a first time are compared to locations and/or identities of the plurality of battery units within the tank at a second time. It is determined whether or not there has been an authorised replacement or servicing of battery units within the tank between said first and second time. If the locations and/or identities of the plurality of battery units within the tank have changed between the first and second time, and there has been no authorised replacement or servicing, then it is determined that the energy storage and supply system has been tampered with.

Further embodiments are presented in claim 2 et seq.

DETAILED DESCRIPTION

System Overview

Figure 1:
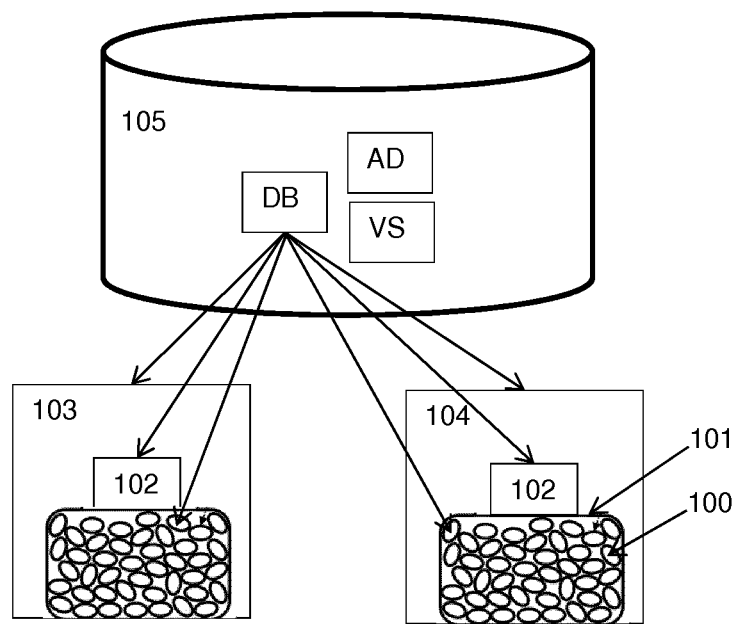
FIG. 1 shows a schematic of a smart battery system.

The smart battery system according to this example comprises the following active parts, as shown in FIG. 1. Further details of each part are provided later in this example.

A plurality of battery units 100 (BUs). These are typically provided and used in several groups, each in a separate container, such as "electric tanks" of battery unit powered devices (e.g. the electric vehicles) or storage/charging containers at service stations.

A plurality of electric tanks 101, each including an electric tank control unit 102 (ETCU), which is controlling battery units located in a certain electric tank. The electric tanks act as storage containers for the battery units, and connect them to the load of the battery powered devices to provide power, or to the power supply of a service station or an external power supply to charge the batteries. The battery units may be randomly packed within the electric tank. Their orientation and location may be unknown a priori, i.e. at the point at which they are loaded into the tank.

A plurality of battery unit powered devices 103, such as the electric vehicles, each with an electric tank.

Optionally one or more service stations 104, which are configured to take depleted battery units from the electric tanks and transfer charged battery units into the containers from the storage/charging container. The depleted battery units are charged so that they can be used to supply further vehicles, or may be discarded if they are judged to be no longer viable. Each service station comprises an electric tank, with an ETCU. In general, for the purposes of this disclosure, the service stations can be considered as equivalent to the battery powered devices (except that some environmental sensors will not apply—e.g. a service station is unlikely to accelerate).

A database and administration server 105, which comprises:

A database DB which maintains administrative and usage history information of the battery units in the system. The administrative information may comprise, for example, the owner of the battery unit, the control profile of the battery unit, hardware and/or software configuration information of the battery unit, valuation history of the battery unit, and/or a unique identifier for the battery unit. The usage history information may comprise for example state of charge, amount of charge/discharge cycles, min or max charging/discharging current, temperature, etc.

A valuation service VS which is configured to provide a transaction value for a battery unit when given usage history information and hardware and/or software configuration information of the battery unit.

An anomaly detection service AD which is configured to detect possibly falsified or abnormal usage history information received from the battery units, electric tanks, electric vehicles and/or service stations.

Battery Units

The present battery units are preferably multi-contact area units, whose outer power delivery contact areas are selectively connectable to terminals of the energy reservoir by programming. Such units are described in more detail in granted patent GB2518196.

Typically many such battery units will be connected in a single electric tank to form a power source. The connection is achieved by programing of the connections between battery unit contacts following random packing of the battery units into the electric tank. The battery units, even if randomly packed inside a tank, can be connected in series and/or in parallel, forming "strings" of many units. Each "string" is a set of battery units connected in series.

All battery units shall have secure data connection to ETCU which can be used to send battery unit usage log information to the centralized computer system. Information may be used for monitoring and anomaly detection purposes.

All battery units monitor and record data, which may include hardware and/or software data, administrative data, and/or state information. The battery-related data may comprise for example some or all of the following data:

Battery unit identification code
Battery unit security data
    access control key data
    access control algorithm identifier
    authentication key data (if different from e.g. access control key data)
    authentication algorithm identifier
    authorization key data (if different from e.g. access control key data)
    authorization algorithm identifier
Battery unit hardware data, such as
    type of the battery unit (incl. e.g. type identifier and/or parameters defining size, shape, number/placement of contacts, IP classification, cooling, or shell material(s))
    type of energy reservoir (incl. e.g. type identifier and/or parameters defining chemistry, capacity, power/current/voltage hard limits)
    type of processing unit (incl. e.g type identifier and/or detailed feature/performance parameters)
    type of cryptoprocessor (incl. e.g. type identifier and/or detailed feature/performance parameters)
    type of memory unit (incl. e.g. type identifier and/or detailed feature/performance parameters)
Battery unit software data, such as
    operating system (firmware) identifier
    operating system (firmware) version information
Battery unit control profile data (=envelope), including e.g.
    control profile identifier
    allowed charge and/or discharge limits
    allowed maximum current limit
    maximum charge and/or discharge cycle limiters
    information relating to authorization of allowed charge and/or discharge entities
    authorization validity and/or expiry data
    logging level data
    alarm threshold data
Battery unit present administrative data, such as
    unit issuer
    unit owner
    unit holder
    authorization state
Battery unit administrative data log, such as
    issuer history
    ownership history
    holder history
    data access (memory read/write) history
    authentication history
    authorization history
    valuation history
Battery unit state information such as
    energy reservoir full capacity
    energy present capacity
    cycle count
    wear level
    environmental sensor readings
    internal resistance
Battery unit state information log, such as
    discharge log (event-based and/or cumulative)
    charge log (event-based and/or cumulative, potentially with separate records for home and service station charges separately)
    environmental state log
    operation failure history
    alarm history The state information is monitored by a monitoring system. The quantities measured may include:
    charge/discharge cycle count;
    charge/discharge current;
    charge/discharge voltage;
    charge/discharge power;
    charge/discharge time;
    energy reservoir charge capacity;
    energy reservoir charge stored;
    internal resistance of the energy reservoir;
    acceleration experienced by the battery;
    shock experienced by the battery;
    humidity;
    temperature;
    operation failures.

The measured state information is stored in a state information log in memory, so that it can be provided to the reporting device for communication to the valuation service.

Any of these values may be the subject of false reporting by the battery unit.

Electric Vehicles and Electric Tanks

Electric vehicles and electric tanks suitable for the present system are described in detail in patents GB2518196 and GB2418197, and summarized below. It will be appreciated that while electric vehicles are used as an example herein, the electric tank may be used for other devices.

The electric tank provides power to EVs engine via a power bus and the EVs control system is connected to the ETCU of the tank via a message bus such as CAN.

The ETCU shall have secure data connection to centralized computer system which can be used to send electric tank usage log information to the centralized computer system. Information may be used for monitoring and anomaly detection purposes.

The ETCU may store and send to centralized computer unit usage log information such as but not limited to:
- charge/discharge current
- charged/discharged energy
- GPS position information
- environmental sensor readings
- operational failure data
- battery unit positions
- battery unit mapping information
- hardware and/or software information of the EV, ETCU, and/or electric tank The ETCU communicates locally with all the battery units located in the electric tank and collects the battery unit usage log data described under the previous heading. The ETCU may have limited amount of storage memory compared to the centralized computer system which means that it typically only stores a short-term log of the data. On the other hand the ECTU has more detailed knowledge of the battery unit positions and relationships than the centralized computer system.

The ECTU shall have secure data connection to centralized computer system which can be used to send electric vehicle usage log information to the centralized computer system. Information may be used for monitoring and anomaly detection purposes.

The electric vehicle may store and send to centralized computer unit usage log information such as but not limited to:
- charge/discharge current
- charged/discharged energy
- GPS position information
- environmental sensor readings
- operational failure data (including crash data)

Service Stations

Service stations and battery unit dispensers suitable for the present use are described in detail in patent GB2516120, and summarized below.

Service station is capable of swapping depleted battery units out from the EV's electric tank and inserting fully charged battery units to the tank in few minutes. Depleted battery units are then inspected and authenticated. Battery units which pass the inspection and authentication are moved to charging and storage container, where the battery units are charged before they are ready to be swapped again. Charging of the battery units is controlled by the ETCU of the charging and storage container.

The ETCU of the service station has the same features as the ETCU of the electric vehicle—except that some environmental sensors are not appropriate (e.g. there would be no need for GPS positioning or accelerometers, as the service station will not move).

Database

Figure 2:
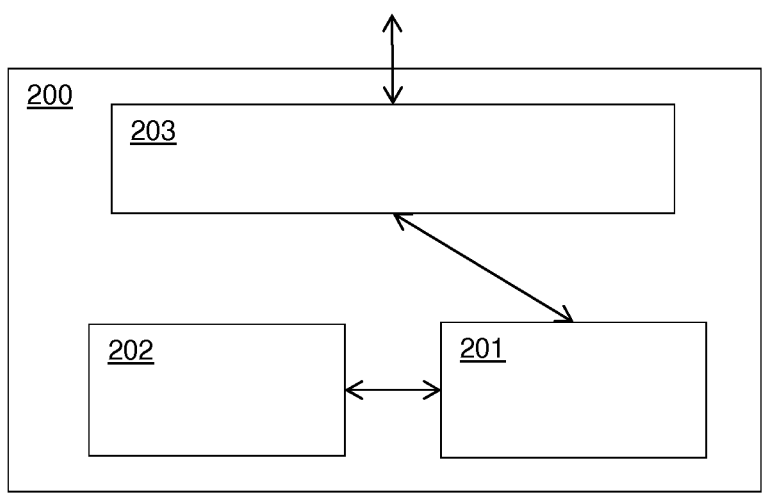
FIG. 2 shows a server on which services according to various of the examples may be implemented.

As shown in FIG. 2, the database and administration server comprises a processor 201, a memory unit 202 containing the database structure in computer-readable form and programs for the operation of the valuation service and anomaly detection service, and a communication unit 203 for internal communication with the valuation service and anomaly detection service and external communication with electric vehicles, electric tanks, service stations and battery units. While the database, valuation service, and anomaly detection service are considered as being present on a single server in this example, the skilled person will appreciate that these may be implemented on separate servers with separate processors, memory, and communication units.

The communication unit of the database server preferably uses for external communication a secure (authenticated and encrypted) communication channel, such as a TLS connection over the internet or cellular network in order to communicate with electric vehicles, electric tanks, service stations and battery units.

The data stored in the database may comprise all or a selected portion of the data contained in the memories of the battery units, provided in suitable data fields such as:
- Battery unit identification
- Owner information
- Authentication and security keys
- Usage profile information, which can be used to control battery unit usage
- Historical battery unit usage log information described above
- Historical battery usage log information from the electric tank described above
- Historical battery usage log information from the electric vehicle described above
- Historical battery usage log information from the service station described above Valuation Service The data processing unit runs a valuation program stored in the memory unit. The program takes as inputs a battery unit usage log information and hardware and/or software configuration information relating to a battery unit, and outputs a transaction value for the battery unit. The battery unit usage log information is obtained from the battery unit to the database, and contains usage and environmental data as detailed in the previous section describing the battery units. The hardware and/or software configuration information is obtained from the database using the unique identifier of the battery unit.

The hardware and/or software configuration information may comprise:
- Details about the battery unit such as:
  - battery chemistry
  - initial charge capacity
  - end-of-life charge capacity
  - initial peak output power
  - end-of-life peak output power
  - environmental tolerances
- Details about other battery unit hardware such as
  - device firmware version
  - device chipset version
  - manufacturing date
  - refurbishment/repair log
  - available sensors The output from the valuation is a transaction value for the battery unit. The transaction value is not necessarily a monetary value, but it is an indication of the wear, suitability for purpose, and expected remaining life of the battery unit which will affect the monetary value of the unit. The transaction value may be formed of multiple 5 scores, e.g. a score representing the battery unit's suitability for high peak power applications, a score representing the battery unit's suitability for low power, long endurance applications, etc. Alternatively, the transaction value may comprise a single score and an indication of the applications to which that score relates.

Anomaly Detection Service

The data processing unit runs an anomaly detection program stored in the memory unit. The program takes as inputs a battery unit usage log information, electric vehicle usage log information, electric tank usage log information and service station usage log information.

The battery unit usage log information is obtained from the battery unit to the database, and contains usage and environmental data as detailed in the previous section describing the battery units. The hardware and/or software configuration information is obtained from the database using the unique identifier of the battery unit.

The electric vehicle battery usage log information is obtained from the electric vehicle to the database, and contains usage and environmental data as detailed in the previous section describing the electric vehicle. The hardware and/or software configuration information is obtained from the database using the unique identifier of the electric vehicle.

The electric tank usage log information is obtained from the electric tank to the database, and contains usage and environmental data as detailed in the previous section describing the electric tank. The hardware and/or software configuration information is obtained from the database using the unique identifier of the electric tank.

Anomaly detection service can also obtain from the database the relations between battery units, electric tanks, electric vehicles and/or service stations. Certain battery unit is located at certain electric tank or service stations container. There is also relation between certain electric tank and electric vehicle.

Anomaly Detection Algorithm

Broadly speaking, there are two ways that the data received from a battery unit or electric tank can be checked. Firstly, the data can be checked against a log of data previously received from the battery unit or electric tank. Secondly, the data can be checked against data received from related devices, e.g. battery units or electric tanks in proximity to or in electrical contact with the device being checked.

Figure 3:
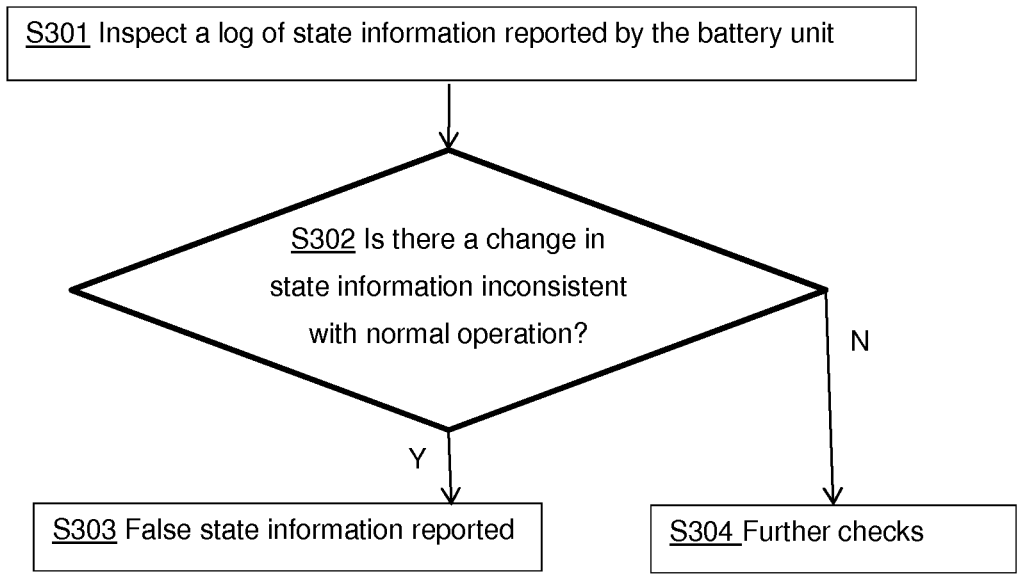
FIG. 3 is a flowchart of an anomaly detection process according to an example.

In the first case, the log is examined for changes in state information which are inconsistent with normal operation—e.g. which would not be physically possible for the battery unit. A flowchart showing this approach is presented in FIG. 3:

S301: A log of state information for a battery unit is inspected. This log may be received from the battery unit, or may be recorded at the database from individual reports of state information received from the battery unit.

S302: It is determined whether the log contains a change in state information which is inconsistent with normal operation (as discussed further in the examples below).

S303: If there is such a change, then it is determined that the battery unit has reported false data.

S304: If there is no such change, then further checks may be performed (e.g. according to the second approach).

Several examples of this approach are presented below.

The anomaly detection service may check the stored values of the charge/discharge cycle count. It can only increase over time, if decrease in cycle count variable is detected it is a clear indication of fraudulent manipulation of the information log data.

The anomaly detection service may check the stored values of the internal resistance. It can only increase over time, if decrease in the internal resistance variable is detected it is a clear indication of fraudulent manipulation of the information log data.

The anomaly detection service may also examine the log data of an electric tank and recognize anomalies in different variables stored to the log. The anomaly detection service may check the stored values of the charged and discharged energy and compare the values stored to electric vehicles usage log information. Energy consumption can be also compared to the GPS position information. Electric vehicles speed and driving distance should match to the energy consumption reported. If a difference greater than a pre-defined threshold is detected it is a clear indication of fraudulent manipulation of the information log data.

The anomaly detection service may also calculate from the longer term usage log data an average daily usage pattern of the electric vehicle. If the daily usage differs a lot from long term average pattern it may be indication of fraudulent manipulation of the information log data.

The anomaly detection service may also check that the battery unit's charging and discharging energy values are matching over time. In this comparison anomaly detection service needs to take into account the internal power consumption of the battery unit's control circuit and self-discharging of the battery cell in case of longer unused period of the electric vehicle.

The anomaly detection service may also check that the electric tank's charging and discharging energy values are matching over time. In this comparison anomaly detection service needs to take into account the internal power consumption of the ETCU, internal power consumption of the battery unit's control circuit and self-discharging of the battery cell in case of longer unused period of the electric vehicle.

Figure 4:
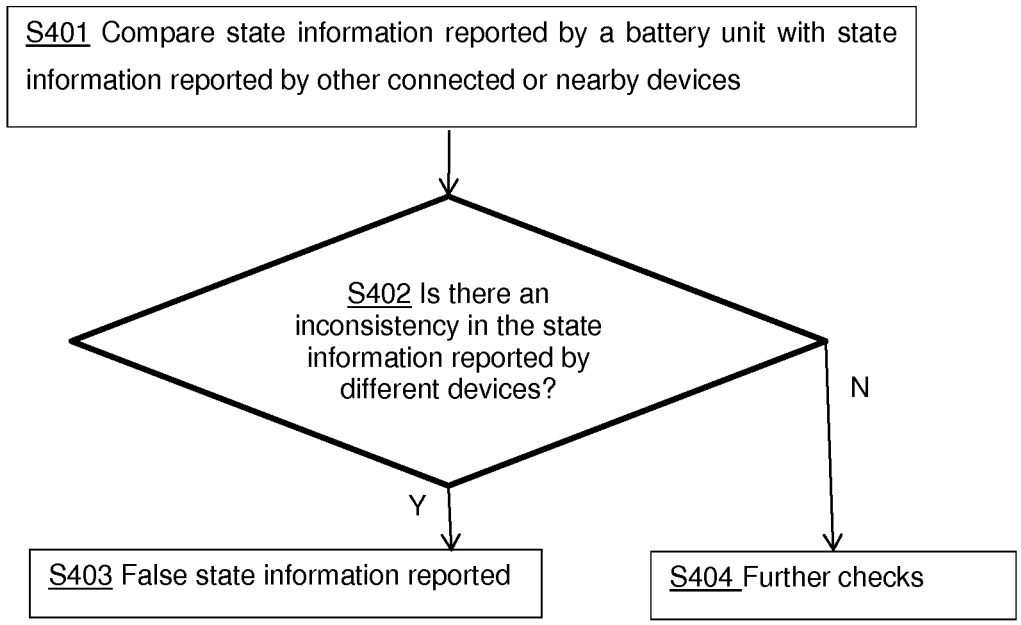
FIG. 4 is a flowchart of an anomaly detection process according to a further example.

In the second case, the data received from a plurality of devices (i.e. battery units, electric tanks, and devices which draw power from electric tanks), and a comparison is made of the data received from different devices to detect anomalies. A flowchart showing this approach is presented in FIG. 4:

S401: State information received from a battery unit is compared with state information reported by other connected or nearby devices. For example, these may be the electric tank or electric vehicle in which the battery unit is stored, other battery units in the electric tank, or other battery units electrically connected to the battery unit.

S402: It is determined there is an inconsistency in state information reported by different devices.

S403: If there is such an inconsistency, then it is determined that the battery unit has reported false data.

S404: If there is no such inconsistency, then further checks may be performed (e.g. according to the second approach).

For example, usage log information may be obtained related to an EV, its electric tank and battery units inside the electric tank. Then the anomaly detection service sums the charged and/or discharged energy amount of all the battery units located in the electric tank (as reported by the battery units themselves). That sum is compared to the charged and/or discharged energy amount information found from usage information logs of the electric tank and electric vehicle.

Since the battery units have small internal integrated control units, which takes its power from the battery unit's energy reservoir this small battery units internal power consumption needs to be taken into account when comparing the reported energy usage information between battery units, electric tank and electric vehicle.

If anomaly detection service finds that the difference between the sum of battery unit usage log information and electric tank and electric vehicle usage log information is bigger than pre-defined threshold value it raises an alarm.

Similar checks may be done for the voltages and currents reported by battery units—the total voltage across a string of battery units should be the same as that reported by the electric tank, and all battery units in a string should have the same current (unless the string splits into multiple parallel strings, in which case the total current of the parallel strings should be the same before and after the split). Other such similar checks will be apparent to the skilled person from commonly known properties of electrical circuits.

If anomaly detection alarm has been raised and electric tank has sent mapping and position information of the battery units to the centralized computer system, anomaly detection service may analyze further the mapping and position information and find exactly which battery unit is sending the falsified or incorrect information. Alternatively, in response to detection of an anomaly with an unspecified battery unit in the tank, the anomaly detection service may request mapping and position information of the battery units from the electric tank so that a determination of which battery unit is reporting false state information can be made.

The anomaly detection service may check the stored values of the temperature for the battery units. The temperature values of each battery unit usage log may be compared to the temperature values reported by the other neighboring battery units, and/or to the temperature values reported by the electric tank or electric vehicle. If the temperature value is significantly lower than the other reference values it is a clear indication of fraudulent manipulation of the information log data.

Anomaly Detection in Electric Tank

Certain anomaly detection operations may be performed either by an anomaly detection service running in the electric tank itself, or at the central anomaly detection service.

The anomaly detection algorithm of the electric tank has access to battery unit usage log information locally stored to the electric tank's memory. It has also access to the information of the exact positions of battery units inside the electric tank and how the battery units are mapped to power strings inside the electric tank.

The anomaly detection algorithm of the electric tank may check that all battery units connected to the same string are reporting the same charging/discharging current that electric tank management unit is measuring from the DC-DC converter handling the corresponding battery unit string.

The anomaly detection algorithm of the electric tank may also check that the charged/discharged energy reported by all the battery units connected to the same string matches to the power input/output measured from the DC-DC converter handling the corresponding battery unit string.

The anomaly detection algorithm of the electric tank may also check that the environmental sensor values like temperature reported by the battery unit matches to the environmental values reported by the battery units positioned nearby.

One important task for anomaly detection in electric tank is to periodically check if there have been unexpected changes in the content of the electric tank. Normally battery units inside the electric tank are changed only during the swap executed by the service station. Failing battery units may also be changed manually by a technician during the electric vehicles maintenance. In these cases electric tank management unit will be informed about the identities of the replaced battery units.

For batteries which are randomly packed in the electric tank, such as those disclosed in GB2518196 and GB2418197, the anomaly detection algorithm of the electric tank may run periodically remapping of the battery units inside the electric tank. This means that the positions of all the battery units are re-measured. The anomaly detection algorithm of the electric tank may then compare the mapping results to the previous mapping results. This will reveal if there have been battery units removed or added without notifying the electric tank management unit. It will also reveal if there is no change in the identities or amount of the battery units but the positions have been shuffled, which should not happen in normal conditions.

Reactions Based on Anomaly Detection

Data collection, processing and storage for anomaly detection can be also designed to include reactions. These reactions are based on the output of the data processing and may be executed either requiring user confirmation or automatically.

The system collects events and patterns that emerge over time. These events are then analyzed and appropriate reactions are defined for the events that require them. For example, system may detect malfunction of certain types of battery units across the system and reacts by sending a request to administrator to verify the situation. In some cases reaction may be sending to the owner of the battery units a message, which describes the detected anomaly and recommends to contact the service point. In critical cases the system may also be configured to perform forced deactivation of the affected battery units, minimizing the risk of wider system malfunction.

The invention claimed is:

1. A method of detecting reporting of false electrical performance data by battery units operating within an energy storage and supply system comprising a tank containing a plurality of randomly packed battery units, the tank having electrical contacts for either drawing energy from battery units or supplying energy to battery units within the tank during normal use, the method comprising:
  receiving from each of the battery units, data reporting energy claimed to have been extracted from or supplied to the battery unit;
  measuring the actual total energy extracted from or supplied to the plurality of battery units; and
  comparing the reported data and the measured data to determine whether or not the battery units are reporting false electrical performance data.

2. A method according to claim 1 and comprising, following determination that the battery units are reporting false electrical performance data, analysing electrical performance data reported by each of the plurality of battery units to determine which of the battery units is reporting false data.

3. A method according to claim 2 and comprising, following determination of which battery unit is reporting false electrical performance data, disconnecting that battery unit from the electrical storage and supply system or disabling that battery unit.

4. A method according to claim 2, wherein determining which of the plurality of battery units is reporting false data comprises, for each of the plurality of battery units, comparing a current reported by the battery unit to current reported by other battery units connected in series to that battery unit.

5. A method according to claim 1, wherein the method is performed at a server.

6. A computer program comprising computer readable code which, when run on an apparatus, causes the apparatus to perform a method according to claim 1.

7. Apparatus configured to detect reporting of false electrical performance data by battery units operating within an energy storage and supply system comprising a tank containing a plurality of randomly packed battery units, the tank having electrical contacts for either drawing energy from battery units or supplying energy to battery units within the tank during normal use, the apparatus comprising:
- a communication unit configured to communicate with the battery units and the electrical storage and supply system;
- an anomaly detection unit configured to, for each of the battery units:
- receive from each of the battery units, data reporting energy claimed to have been extracted from or supplied to the battery unit;
- measure the actual total energy extracted from or supplied to the plurality of battery units; and
- compare the reported data and the measured data to determine whether or not the battery units are reporting false electrical performance data.

\* \* \* \* \*